(12) United States Patent
Chao et al.

(10) Patent No.: US 9,977,192 B2
(45) Date of Patent: May 22, 2018

(54) OPTICAL RECEIVER AND OPTICAL TRANSCEIVER

(71) Applicant: Industrial Technology Research Institute, Hsinchu (TW)

(72) Inventors: Chia-Hsin Chao, Hsinchu County (TW); Yen-Hsiang Fang, New Taipei (TW); Chun-Hsing Lee, Hsinchu (TW); Kai-Ning Ku, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 178 days.

(21) Appl. No.: 15/222,961

(22) Filed: Jul. 29, 2016

(65) Prior Publication Data
US 2017/0031104 A1 Feb. 2, 2017

Related U.S. Application Data

(60) Provisional application No. 62/198,645, filed on Jul. 29, 2015.

(51) Int. Cl.
*H01J 40/14* (2006.01)
*G02B 6/34* (2006.01)
*G02B 6/42* (2006.01)
*G02B 6/12* (2006.01)
(Continued)

(52) U.S. Cl.
CPC .............. *G02B 6/34* (2013.01); *G01J 1/0209* (2013.01); *G01J 1/0407* (2013.01);
(Continued)

(58) Field of Classification Search
CPC ...... G02B 6/34; G02B 6/4206; G02B 6/4214; G01J 1/0425
(Continued)

(56) References Cited

U.S. PATENT DOCUMENTS 7,332,368 B2  2/2008  Yaung et al.
8,119,436 B2  2/2012  Park
(Continued)

FOREIGN PATENT DOCUMENTS

CN  1806270    7/2006
CN  105222895   1/2016
TW  201137328   11/2011

OTHER PUBLICATIONS

Neumann et al., "CMOS-compatible plenoptic detector for LED lighting applications", Optics Express, Aug. 25, 2015, pp. 1-9.
(Continued)

*Primary Examiner* — Kevin Pyo
(74) *Attorney, Agent, or Firm* — JCIPRNET

(57) ABSTRACT

An optical receiver including a photodetector and a waveguide is provided. The photodetector includes a plurality of photosensitive regions arranged in an array. The waveguide is disposed on the photodetector and includes a plurality of gratings, a plurality of optical channels, and a plurality of light-deflection elements. The gratings are respectively adapted to collect light beams incident on the waveguide at different angles. The optical channels are adapted to propagate the light beams collected by the gratings. The light-deflection elements are disposed on transmission paths of the light beams propagating in the optical channels and are located above the photosensitive regions. The light-deflection elements are adapted to propagate the light beams propagating in the optical channels to the photosensitive regions. An optical transceiver is also provided.

24 Claims, 13 Drawing Sheets

(51) Int. Cl.
  *G02B 6/30* (2006.01)
  *H01S 5/042* (2006.01)
  *H01S 5/12* (2006.01)
  *H05K 3/30* (2006.01)
  *G01J 1/04* (2006.01)
  *G01J 1/02* (2006.01)
  *H04B 10/079* (2013.01)

(52) U.S. Cl.
  CPC ........ *G01J 1/0422* (2013.01); *G02B 6/12004* (2013.01); *G02B 6/305* (2013.01); *G02B 6/4206* (2013.01); *G02B 6/4214* (2013.01); *H01S 5/0425* (2013.01); *H01S 5/12* (2013.01); *H04B 10/079* (2013.01); *H05K 3/30* (2013.01); *G02B 2006/12121* (2013.01); *G02B 2006/12147* (2013.01); *H05K 2203/0147* (2013.01); *H05K 2203/163* (2013.01)

(58) Field of Classification Search
  USPC ............... 250/227.11, 227.24; 385/9, 10
  See application file for complete search history.

(56) References Cited

U.S. PATENT DOCUMENTS

| | | |
|---|---|---|
| 9,239,507 B2 | 1/2016 | Chen et al. |
| 2004/0184732 A1 | 9/2004 | Zhou |
| 2009/0160002 A1 | 6/2009 | Yun |
| 2010/0126577 A1 | 5/2010 | Wu et al. |
| 2012/0269516 A1 | 10/2012 | Liu et al. |
| 2016/0087724 A1* | 3/2016 | Liu ............... H04B 10/25752 398/79 |

OTHER PUBLICATIONS

"Office Action of China Counterpart Application," dated Aug. 2, 2017, p. 1-p. 6.

"Notice of Allowance of Taiwan Counterpart Application," dated Dec. 19, 2017, p. 1-p. 3.

* cited by examiner

US 9,977,192 B2

OPTICAL RECEIVER AND OPTICAL TRANSCEIVER

CROSS-REFERENCE TO RELATED APPLICATION

This application claims the priority benefit of U.S. provisional application Ser. No. 62/198,645, filed on Jul. 29, 2015. The entirety of the above-mentioned patent application is hereby incorporated by reference herein and made a part of this specification.

TECHNICAL FIELD

The disclosure relates to an optical communications element, and more particularly, to an optical receiver and an optical transceiver.

BACKGROUND

Optical communication uses light beams as carriers to carry information. Using visible light communication (VLC) as an example, visible light is modified to carry information, such that the optical receiver or optical transceiver within the irradiation range of visible light can receive information from the visible light modified to carry information. In addition to precise positioning, visible light also has advantages such as energy efficiency, no electromagnetic interference, and safe communications channel, and therefore visible light communication has become a key R&D focus in optical communications.

The current optical receiver or optical transceiver applied in visible light communication mainly adopts a Fresnel lens to converge visible light modified to carry information in a photodiode. However, limited to the angle for receiving light of the Fresnel lens, the current optical receiver or optical transceiver is only adapted to collect light beams within 14 degrees of the angle of incidence and the optical axis of the photodiode, such that the application range of the optical receiver or the optical transceiver is limited. Therefore, how to alleviate the above issue is an important topic for those skilled in the art.

SUMMARY

The disclosure provides an optical receiver and an optical transceiver having a large angle for receiving light.

An optical receiver of the disclosure includes a photodetector and a waveguide. The photodetector includes a plurality of photosensitive regions arranged in an array. The waveguide is disposed on the photodetector and includes a plurality of gratings, a plurality of optical channels, and a plurality of light-deflection elements. The gratings are respectively adapted to collect light beams incident on the waveguide at different angles. The optical channels are adapted to propagate the light beams collected by the gratings. The light-deflection elements are disposed on transmission paths of the light beams propagating in the optical channels and are located above the photosensitive regions. The light-deflection elements are adapted to propagate the light beams propagating in the optical channels to the photosensitive regions.

An optical transceiver of the disclosure includes the optical receiver and an optical upload device.

An optical receiver of the disclosure includes a photodetector, a waveguide, and a plurality of first light-blocking elements. The photodetector includes a plurality of photosensitive regions arranged in an array. The waveguide is disposed on the photodetector and includes a plurality of gratings and a plurality of optical channels, wherein the gratings are located on the optical channels and are respectively adapted to collect light beams incident on the waveguide at different angles. The first light-blocking elements block the photosensitive regions, wherein the first light-blocking elements are disposed on the waveguide and are respectively located between two adjacent gratings.

Based on the above, since the gratings have the characteristic of angle of incidence dependency, the waveguide is adapted to collect light beams incident on the waveguide at different angles via the plurality of gratings, and then the light beams collected by the waveguide are propagated to the photodetector via the optical channels and the light-deflection elements. Therefore, the optical receiver of the disclosure and the optical transceiver adopting the optical receiver can have a large angle for receiving light, and the application range of the optical receiver and the optical transceiver adopting the optical receiver can be increased.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
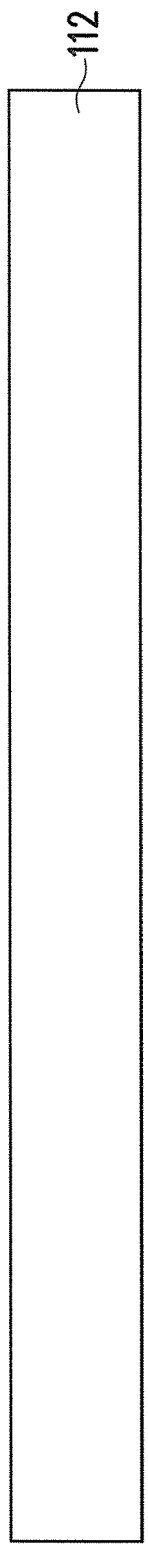
FIG. 1A to FIG. 1G are cross-sectional schematic views of the manufacturing process of an optical receiver according to the first embodiment of the disclosure.
Figure 1B:
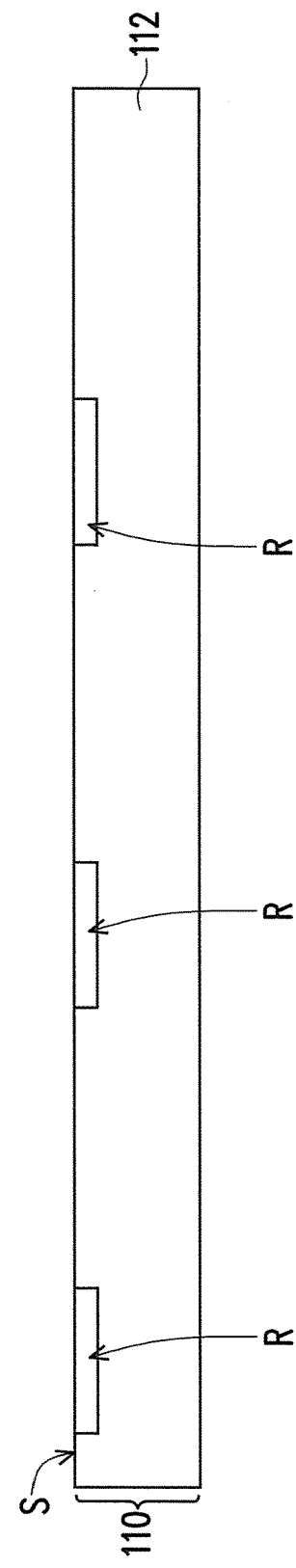
Figure 1C:
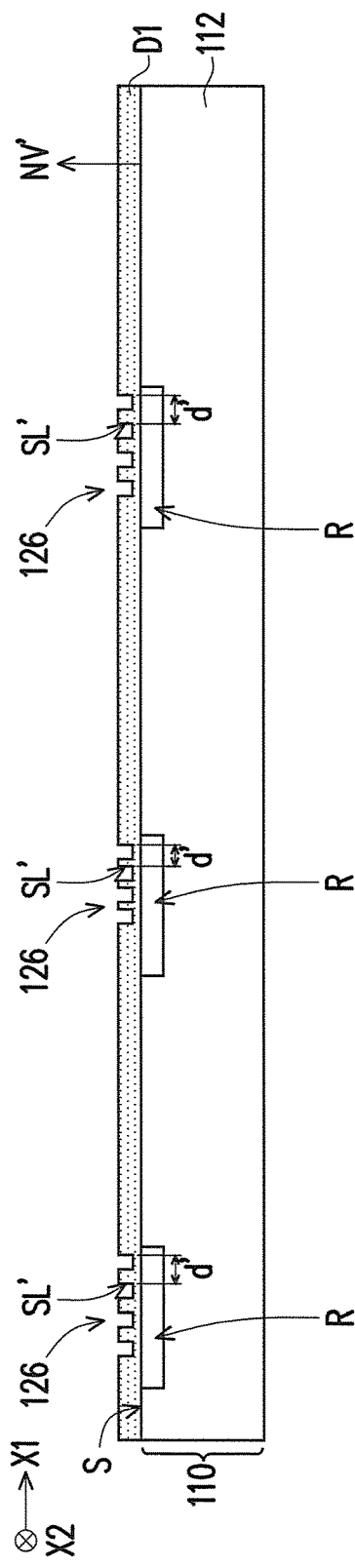
Figure 1D:
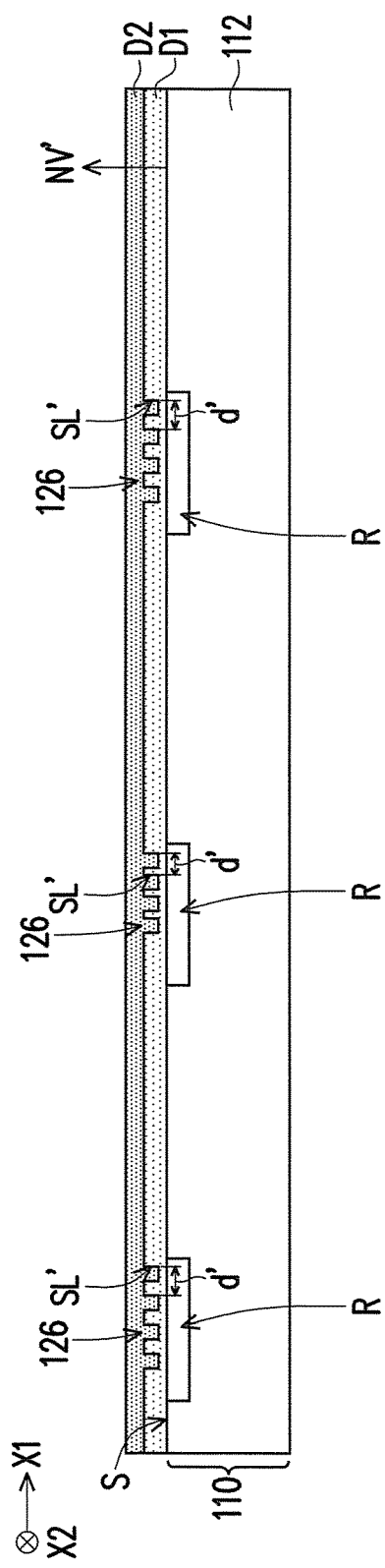
Figure 1E:
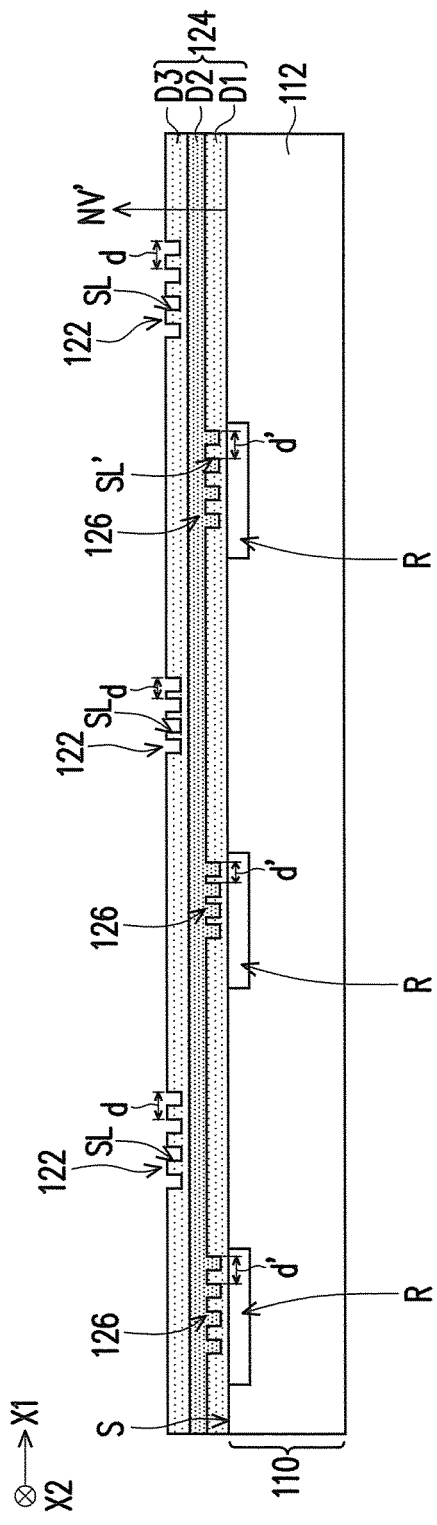
Figure 1F:
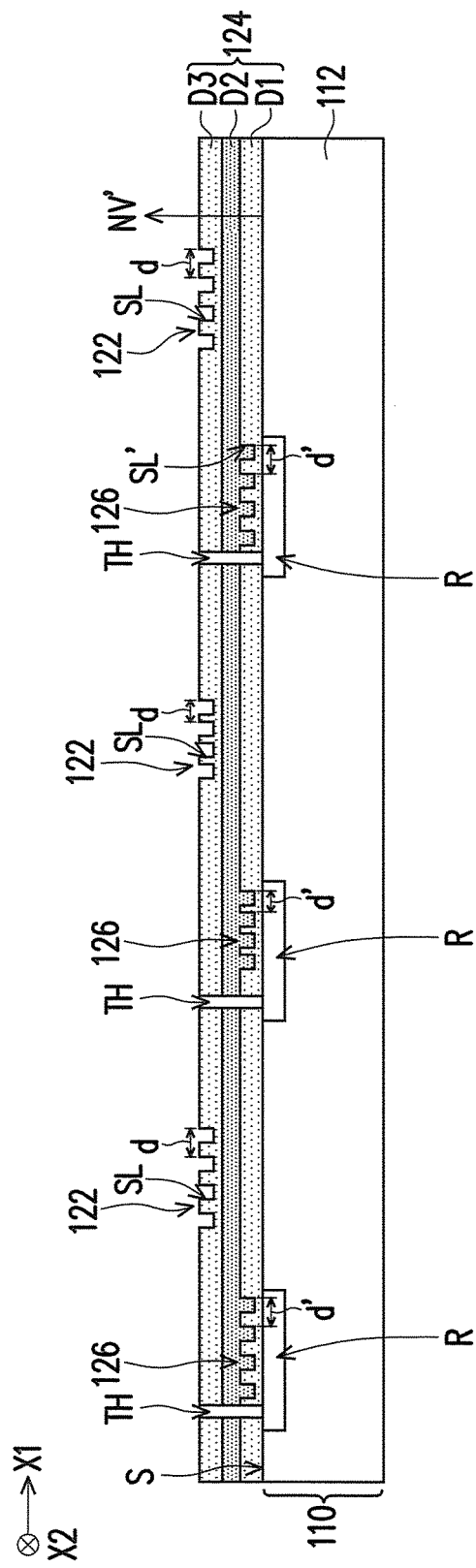
Figure 1G:
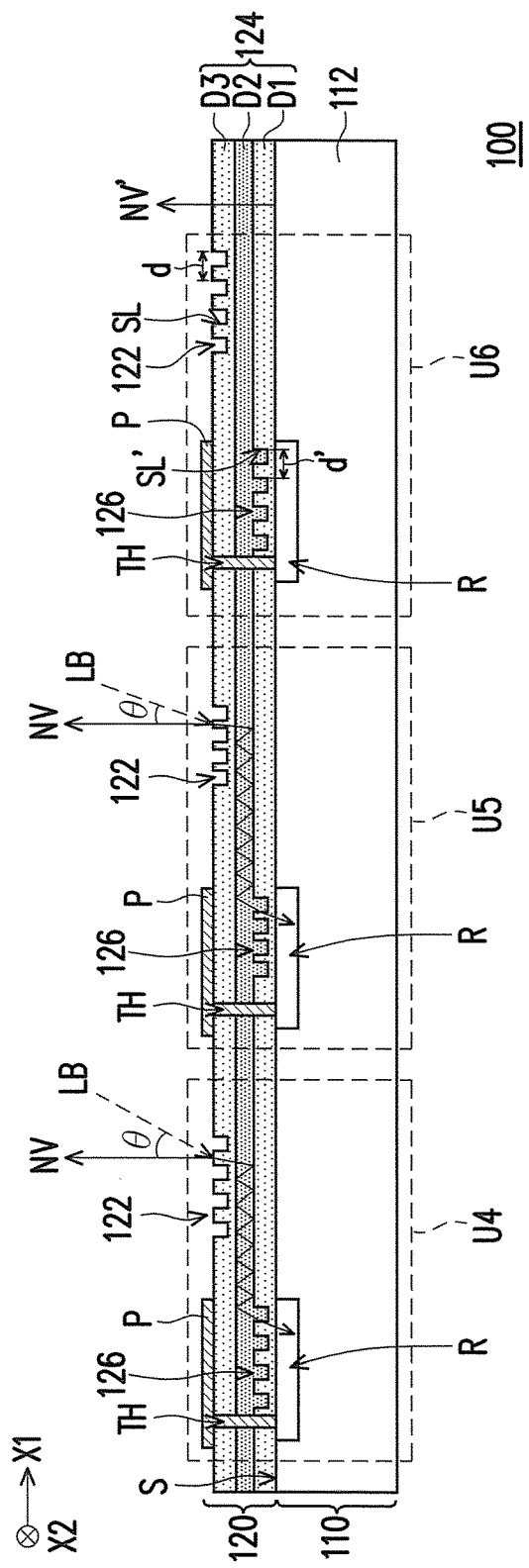
Figure 2:
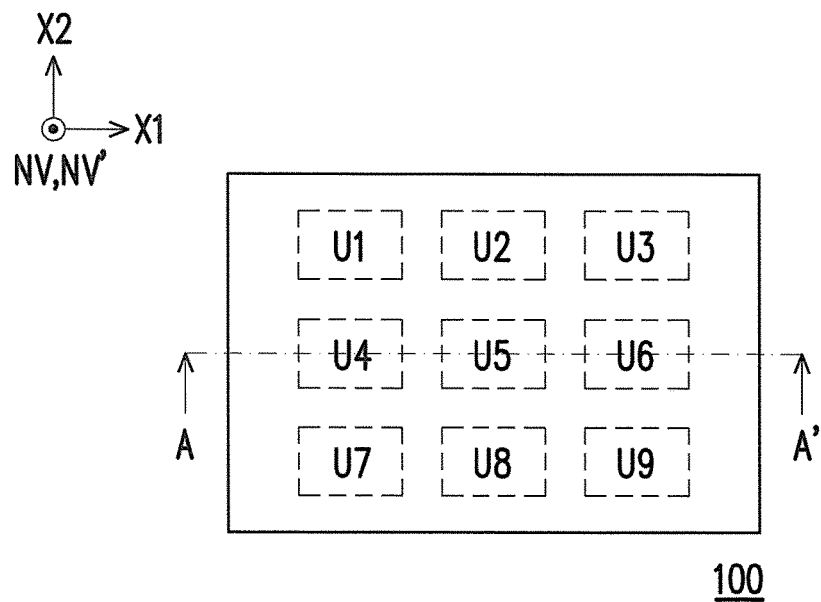
FIG. 2 is a top schematic view of an optical receiver according to the first embodiment of the disclosure.
Figure 3:
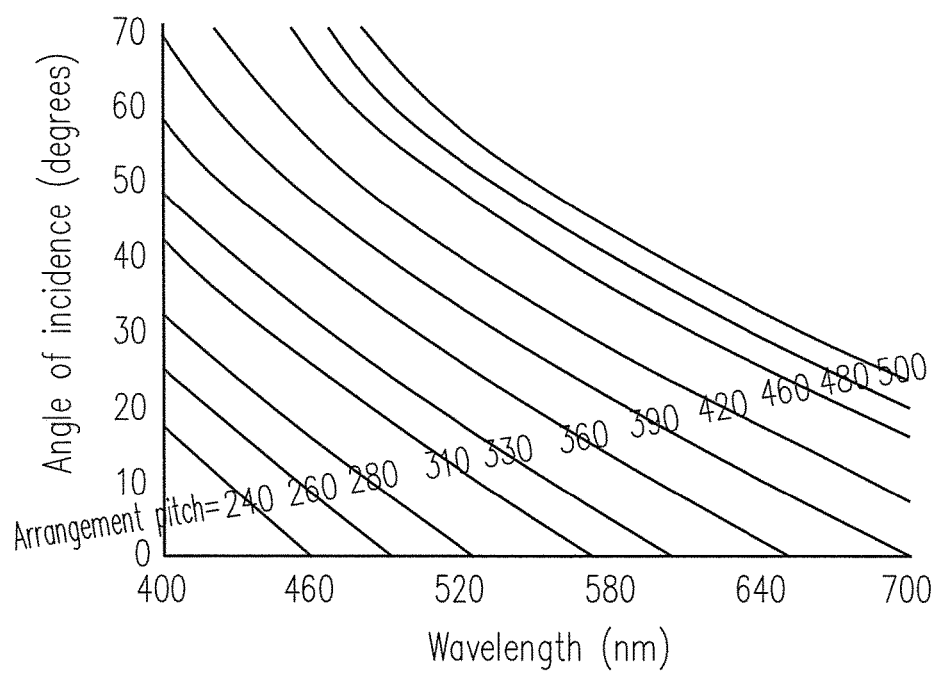
FIG. 3 shows the relationship between wavelength and angle of incidence at different arrangement pitches.
Figure 4:
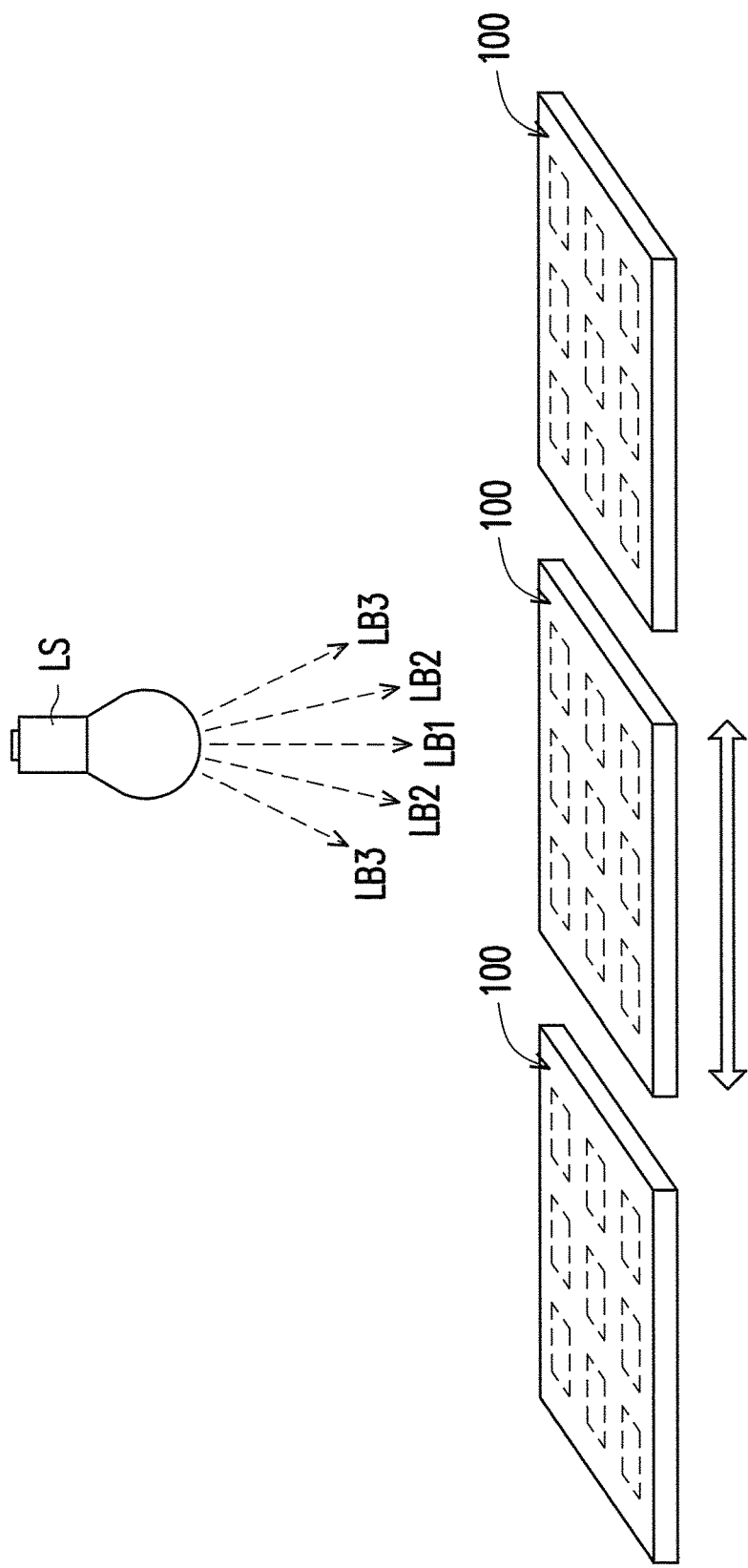
FIG. 4 is an operation schematic view of the optical receiver of FIG. 2.

FIG. 1A to FIG. 1G are cross-sectional schematic views of the manufacturing process of an optical receiver according to the first embodiment of the disclosure. FIG. 2 is a top schematic view of an optical receiver according to the first embodiment of the disclosure. The sectional view of line A-A' in FIG. 2 is as shown in FIG. 1G. FIG. 3 shows the relationship between wavelength and angle of incidence at different arrangement pitches. FIG. 4 is an operation schematic view of the optical receiver of FIG. 2.

Referring first to FIG. 1G, an optical receiver 100 includes a photodetector 110 and a waveguide 120. The photodetector 110 includes a plurality of photosensitive regions R arranged in an array. The photodetector 110 can be a CMOS sensor, a photodiode array, or other suitable photosensitive elements. For instance, the manufacturing method of the photodetector 110 is as shown in the steps of FIG. 1A and FIG. 1B. First, a substrate 112 is provided. The substrate 112 is, for instance, a P-type silicon substrate, but is not limited thereto. Next, photosensitive regions R are formed in the region of the substrate 112 adjacent to a sensing surface S via an ion implantation process. The photosensitive regions R are, for instance, heavily-doped N-type regions in the substrate 112, but are not limited thereto.

Referring further to FIG. 1G, the waveguide 120 is disposed on the photodetector 110 and includes a plurality of gratings 122, a plurality of optical channels 124, and a plurality of light-deflection elements 126. The gratings 122 are adapted to collect light beams LB incident on the waveguide 120. The optical channels 124 are adapted to propagate the light beams LB collected by the gratings 122. The light-deflection elements 126 are disposed on transmission paths of the light beams LB propagating in the optical channels 124 and located above the photosensitive regions R, wherein the light-deflection elements 126 are adapted to propagate the light beams LB propagating in the optical channels 124 to the photosensitive regions R.

Specifically, the optical channels 124 can be any medium adapted to propagate the light beams LB. For instance, the optical channels 124 can include a first dielectric layer D1, a second dielectric layer D2, and a third dielectric layer D3 stacked on the photodetector 110 in order, wherein the index of refraction of the second dielectric layer D2 is higher than the indices of refraction of the first dielectric layer D1 and the third dielectric layer D3. As a result, the light beams LB can be propagated in the second dielectric layer D2 via total reflection. In the present embodiment, the light-deflection elements 126 are, for instance, gratings, and the light-deflection elements 126 can be formed on the first dielectric layer D1 and the gratings 122 can be formed on the third dielectric layer D3.

The manufacturing method of the waveguide 120 is as shown in the steps of FIG. 1C to FIG. 1G. Referring to FIG. 1C, the first dielectric layer D1 is formed on the photodetector 110. The first dielectric layer D1 can comprehensively cover the sensing surface S of the substrate 112, and the material of the first dielectric layer D1 can include silicon oxide, but is not limited thereto. Next, the light-deflection elements 126 are formed on the first dielectric layer D1. The light-deflection elements 126 are, for instance, formed by a plurality of slits SL' arranged in parallel and formed on the first dielectric layer D1.

The arrangement directions of the slits SL' and the extending direction of each thereof are both perpendicular to a normal vector NV' of the photodetector 110. For instance, the slits SL' of the light-deflection elements 126 can all be arranged along a first direction X1, and the slits SL' can respectively all be extended along a second direction X2 perpendicular to the first direction X1, but are not limited thereto.

The slits SL' of each of the light-deflection elements 126 have an arrangement pitch d'. The size of the arrangement pitch d' can be controlled by adjusting the width of each of the slits SL' or the spacing between the slits SL'. Based on different design requirements, the slits SL' of the light-deflection elements 126 can have two or more arrangement pitches d'. For instance, the arrangement pitch d' of the slits SL' of each of the light-deflection elements 126 located in the periphery can be greater than the arrangement pitch d' of the slits SL' of each of the light-deflection elements 126 located in the center, but is not limited thereto.

Referring to FIG. 1D, the second dielectric layer D2 is formed on the first dielectric layer D1. The second dielectric layer D2 can comprehensively cover the first dielectric layer D1 and be filled in the slits SL' of the light-deflection elements 126. The material of the second dielectric layer D2 can include silicon nitride ($Si_3N_4$), but is not limited thereto.

Referring to FIG. 1E, the third dielectric layer D3 is formed on the second dielectric layer D2. The third dielectric layer D3 can comprehensively cover the second dielectric layer D2, and the material of the third dielectric layer D3 can include silicon oxide, but is not limited thereto. Next, the gratings 122 are formed on the third dielectric layer D3. The gratings 122 are, for instance, formed by a plurality of slits SL arranged in parallel and formed on the third dielectric layer D3.

The arrangement directions of the slits SL and the extending direction of each thereof are both perpendicular to the normal vector NV' of the photodetector 110. For instance, the slits SL of the gratings 122 can all be arranged along the first direction X1, and the slits SL can respectively all be extended along the second direction X2, but are not limited thereto.

The slits SL of each of the gratings 122 have an arrangement pitch d. The size of the arrangement pitch d can be controlled by adjusting the width of each of the slits SL or the spacing between the slits SL. Based on different design requirements, the slits SL of the gratings 122 can have two or more arrangement pitches d. For instance, the arrangement pitch d of the slits SL of each of the gratings 122 located in the periphery can be greater than the arrangement pitch d of the slits SL of each of the gratings 122 located in the center, but is not limited thereto.

Referring to FIG. 1F, a plurality of through-holes TH is formed in the optical channels 124, and each of the through-holes TH exposes at least a portion of one of the photosensitive regions R. Referring to FIG. 1G, a plurality of first light-blocking elements P is formed on the third dielectric layer D3 of the waveguide 120. The first light-blocking elements P are respectively located between two adjacent gratings 122, and each of the light-deflection elements 126 is located between one of the first light-blocking elements P and the corresponding photosensitive region R. More specifically, the first light-blocking elements P are located above the photosensitive regions R and block the photosensitive regions R. The orthographic projection (not shown) of each of the first light-blocking elements P on the sensing surface S can block the orthographic projection (not shown) of the corresponding light-deflection elements 126 on the sensing surface S. As a result, interference caused by direct irradiation to the light-deflection elements 126 by external light beams can be prevented. Moreover, the orthographic projection (not shown) of each of the first light-blocking elements P on the sensing surface S can also block the orthographic projection (not shown) of the corresponding photosensitive region R on the sensing surface S to prevent direct irradiation to the photosensitive regions R by external light beams.

In the present embodiment, the first light-blocking elements P adopt a conductive material, and each of the first light-blocking elements P is filled in the corresponding through-hole TH and is in contact with the corresponding photosensitive region R. As a result, signals collected by the photosensitive regions R can be exported. In other words, in addition to blocking the interference to the photosensitive regions R by external light beams, the first light-blocking elements P of the present embodiment can also be used to export the signals collected by the photosensitive regions R. In another embodiment, the optical receiver 100 can further include pads for exporting the signals collected by the photosensitive regions R, and the first light-blocking elements P are only used to block light. Moreover, the ratio of the total area of the first light-blocking elements P and the total area of the optical receiver 100 is less than 20%. Furthermore, the ratio of the total area of the gratings 122 and the total area of the optical receiver 100 is greater than or equal to 50%, and is preferably greater than or equal to 80%. The area ratios above are applicable to all of the embodiments including the first light-blocking elements or the gratings, and are therefore not repeated herein.

Referring to formula (1) and FIG. 1G, θ is the angle of incidence of the light beams LB. Here, the angle of incidence θ is defined as the angle between the normal vectors NV of the waveguide 120 and the light beams LB. n is the equivalent refractive index of the optical channels 124, and λ is the wavelength of the light beams LB. Based on formula (1), when the index of refraction n is a constant, the angle of incidence θ of the light beams LB collected by the gratings 122 is related to the wavelength λ of the light beams LB and the arrangement pitch d of the slits SL.

$$\sin\theta \pm \frac{d}{\lambda} = \pm n \qquad \text{formula (1)}$$

Under irradiation by a light source having a single wavelength, referring to FIG. 3, when the index of refraction n and the wavelength λ are constants, a greater arrangement pitch d of the slits SL means that the light beams LB can be collected by the gratings 122 at a greater angle of incidence θ. In other words, since the slits SL of the gratings 122 have two or more arrangement pitches d, the gratings 122 can respectively collect the light beams LB incident on the waveguide 120 at different angles θ. As a result, not only can the angle for receiving light of the optical receiver 100 be increased, the application range of the optical receiver 100 can also be increased.

Moreover, under irradiation by light sources having a plurality of different wavelengths, the arrangement pitch d of the slits SL can be designed based on the wavelength λ of the light beams LB such that the gratings 122 respectively collect the light beams LB having different wavelengths A incident on the waveguide 120 at different angles θ. As a result, the optical receiver 100 can still have a large angle for receiving light and a large application range under the irradiation of the light sources having different wavelengths.

Using the structure of FIG. 2 as an example, the optical receiver 100 can be divided into a plurality of photosensitive units based on the distribution of the gratings 122, such as photosensitive units U1, U2, U3, U4, U5, U6, U7, U8, and U9. The photosensitive unit U1 to the photosensitive unit U9 are arranged in an array, such as a 3-by-3 array, but are not limited thereto. Each of the photosensitive units covers one grating 122, one light-deflection element 126, and one photosensitive region R. However, the quantity of the gratings 122, the light-deflection elements 126, and the photosensitive regions R in each of the photosensitive units can be changed as needed and is not limited to the illustration of FIG. 1G. For instance, the quantity of the light-deflection elements 126 and the photosensitive regions R in each of the photosensitive units can be a plurality, but is not limited thereto.

The slits SL in the photosensitive unit U5 in the center of the optical receiver 100 can have a small arrangement pitch d, such that the gratings 122 are adapted to collect light beams having a small angle of incidence θ (such as a light beam LB1 in FIG. 4). The slits SL in the photosensitive units U2, U4, U6, and U8 adjacent to the photosensitive unit U5 can respectively have a medium arrangement pitch d, such that the gratings 122 are adapted to collect light beams having a slightly greater angle of incidence θ (such as a light beam LB2 in FIG. 4). The slits SL in the photosensitive units U1, U3, U7, and U9 far away from the photosensitive unit U5 can respectively have a large arrangement pitch d, such that the gratings 122 are adapted to collect light beams having a greater angle of incidence θ (such as a light beam LB3 in FIG. 4). As a result, the optical receiver 100 are adapted to collect light beams incident on the waveguide 120 at different angles θ.

It should be mentioned that, photosensitive units corresponding to different arrangement pitches d can also be randomly arranged. Alternatively, the photosensitive units can also be arranged along a single direction and are not limited to the above. Moreover, the arrangement pitch d' of the slits SL' of each of the light-deflection elements 126 matches the arrangement pitch d of the slits SL of the corresponding gratings 122, such that each of the light-deflection elements 126 can propagate the light beams LB collected by the corresponding grating 122 to the corresponding photosensitive region R, and the issue of interference caused by the remaining light beams (such as the light beams LB collected by the non-corresponding gratings 122 or external light beams) propagated to the photosensitive region R can be prevented. As a result, the optical receiver 100 can have better signal-to-noise ratio (SNR). In the present embodiment, the slits SL' are formed on the first dielectric layer D1, and the slits SL are formed on the third dielectric layer D3. Since the material of the first dielectric layer D1 and the third dielectric layer D3 is the same, in each of the photosensitive units, the arrangement pitch d' of the slits SL' of the light-deflection elements 126 is, for instance, the same as the arrangement pitch d of the slits SL of the gratings 122, but is not limited thereto.

It should be mentioned that, the arrangement directions (or extending directions) of the slits SL (or the slits SL') are not limited to be completely the same. In other embodiments, the slits SL can have two or more arrangement directions (or extending directions). Using the structure of FIG. 2 as an example, the slits SL (or the slits SL') in the photosensitive units U4, U5, and U6 can all be arranged along the first direction X1, and the slits SL can be respectively extended along the second direction X2. The slits SL in the photosensitive units U1, U2, U3, U7, U8, and U9 can all be arranged along the second direction X2, and the slits SL can be respectively extended along the first direction X1. As a result, the direction of receiving light of the optical receiver 100 can be increased.

In comparison to a traditional optical receiver adopting the design of a Fresnel lens with a photodiode, in addition to having a greater angle for receiving light, the optical receiver 100 of the present embodiment can also have better SNR. Moreover, in comparison to the size of a traditional optical receiver (width, length, and thickness of respectively 30 mm, 30 mm, and 17.5 mm), the optical receiver 100 of the present embodiment can have a smaller size. Using photosensitive units arranged in a 4-by-4 array as an example, the width, length, and thickness of the optical receiver 100 can respectively be 9 mm, 18 mm, and 1 mm. Therefore, the optical receiver 100 of the present embodiment is more readily integrated in a portable device. In actual operation, the optical receiver 100 can be disposed on the back cover of a smart phone or in a smart watch or other portable devices.

Referring to FIG. 4, by moving the optical receiver 100 within the irradiation range of a light source LS, the optical receiver 100 can collect at least one of the light beam LB1, the light beam LB2, and the light beam LB3 modified to carry information. A back-end processing circuit (not shown) coupled to the optical receiver 100 can confirm the quantity of the photosensitive units detecting the light beams and confirm the location of the photosensitive units detecting the light beams, and photocurrent signals generated by the photosensitive regions R can be converted to voltage signals using an element such as a transimpedance amplifier (TIA), and voltage electrical signals can be amplified. Here, the quantity of the TIA can be less than or equal to the quantity of the photosensitive regions R (or photosensitive units).

The back-end processing circuit can decide whether to start the download of information based on the quantity of the photosensitive units detecting the light beams. For instance, the optical receiver 100 can be configured to start the download of information when the quantity of the photosensitive units detecting the light beams is greater than or equal to 2. When the quantity of the photosensitive units detecting the light beams is 0, the back-end processing circuit can remind the user to change the location of the optical receiver 100 via a user interface. When the quantity of the photosensitive units detecting the light beams is not 0 and greater than or equal to 1, the back-end processing circuit can then determine whether the quantity of the photosensitive units detecting the light beams is greater than or equal to 2. If the quantity of the photosensitive units detecting the light beams is equal to 1, then the back-end processing circuit can remind the user whether to change the location of the optical receiver 100 via the user interface. If the user agrees to perform data transmission via a single photosensitive unit, then the back-end processing circuit can make the optical receiver 100 start the download of information. If the user is to perform data transmission using a plurality of photosensitive units, then the location of the optical receiver 100 is changed. After the user changes the location of the optical receiver 100, the back-end processing circuit performs the determination again. If the back-end processing circuit detects that the quantity of the photosensitive units detecting the light beams is greater than or equal to 2, then the optical receiver 100 is instructed to start the download of information.

In the following, the other implementations of the optical receiver are described via FIG. 5 to FIG. 9, wherein the same elements are shown with the same reference numerals, and the material, location, and function of the same elements are not repeated herein. FIG. 5 to FIG. 9 are respectively cross-sectional schematic views of optical receivers according to the second embodiment to the sixth embodiment of the disclosure.

Figure 5:
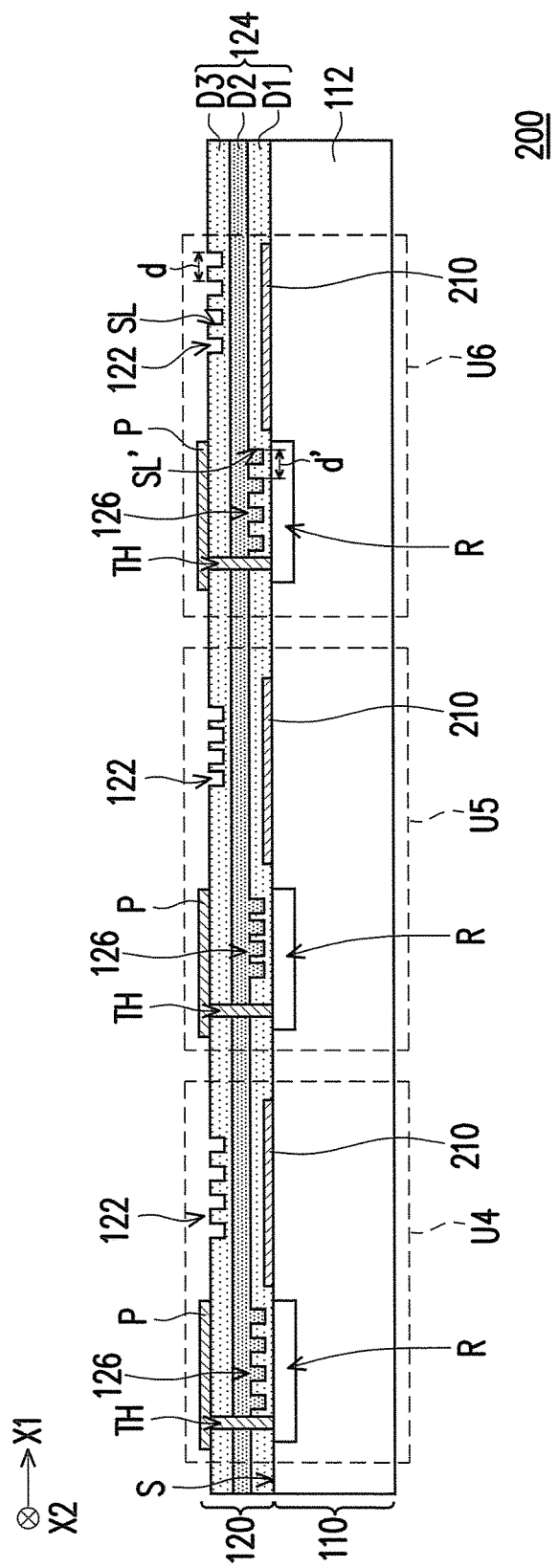
FIG. 5 to FIG. 9 are respectively cross-sectional schematic views of optical receivers according to the second embodiment to the sixth embodiment of the disclosure.

Referring to FIG. 5, an optical receiver 200 is similar to the optical receiver 100 of FIG. 1G. The main difference between the two is: the optical receiver 200 further includes a plurality of second light-blocking elements 210. The second light-blocking elements 210 are located between the waveguide 120 and the photodetector 110, and each of the second light-blocking elements 210 is located below one of the gratings 122. The second light-blocking elements 210 are adapted to block light beams directly passing through the gratings 122 and propagating toward the photodetector 110. The second light-blocking elements 210 can be single or multiple metal layers, but are not limited thereto. In another embodiment, the second light-blocking elements 210 can be replaced by solar cell elements. As a result, the solar cell elements can absorb stray light and increase battery life.

Figure 6:
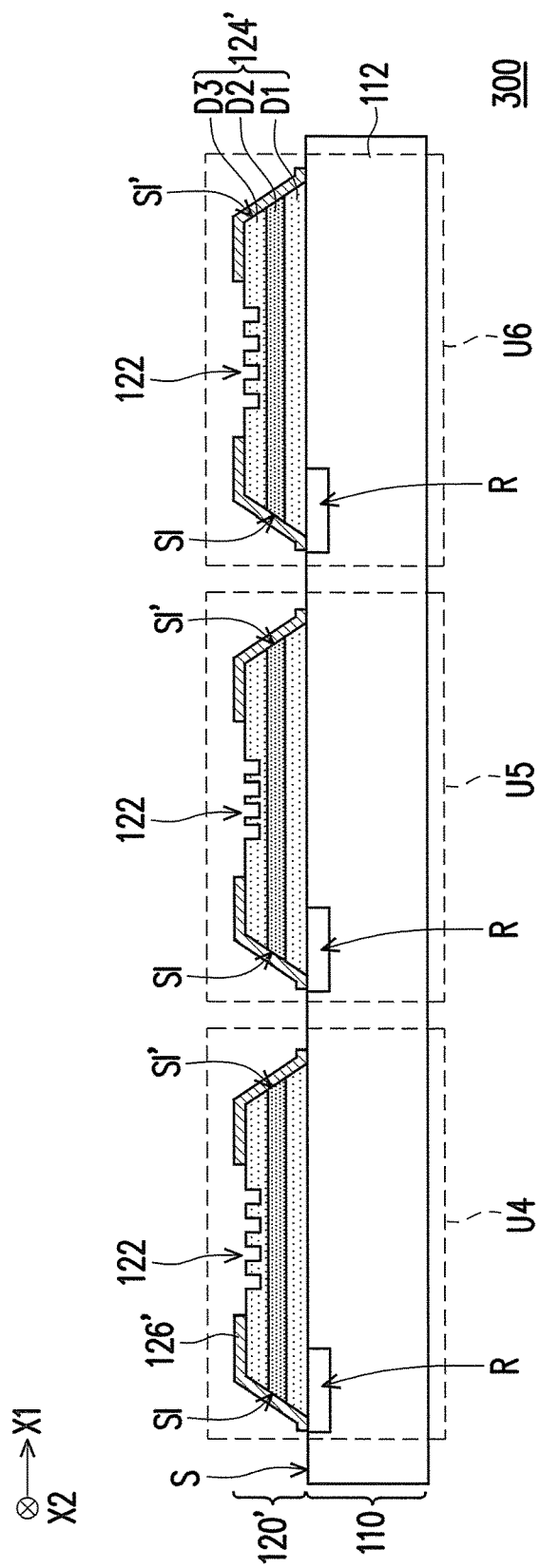

Referring to FIG. 6, an optical receiver 300 is similar to the optical receiver 100 of FIG. 1G. The main difference between the two is: in a waveguide 120', light-deflection elements 126' are, for instance, reflective layers. Optical channels 124' have a plurality of inclined planes SI located on the photosensitive regions R, and the light-deflection elements 126' cover the inclined planes SI to reflect the light beams propagating in the optical channels 124' to the photosensitive regions R.

In the present embodiment, the material of the light-deflection elements 126' can adopt a conductive reflective material such that in addition to being used to reflect light beams, the light-deflection elements 126' can also be used to export signals. As a result, the optical receiver 300 can omit the first light-blocking elements P of FIG. 1G.

Moreover, the orthographic projection (not shown) of the light-deflection elements 126' on the sensing surface S can block the orthographic projection (not shown) of the photosensitive regions R on the sensing surface S to prevent direct irradiation to the photosensitive regions R by external light beams. In other words, the light-deflection elements 126' of the present embodiment can also be used as light-blocking elements blocking interference to the photosensitive regions R by external light beams.

The optical channels 124' can further have a plurality of inclined planes SI'. Each of the inclined planes SI' and the corresponding inclined plane SI are respectively disposed at two opposite sides of the corresponding grating 122. The light-deflection elements 126' can further cover the inclined planes SI'. The light-deflection elements 126' disposed on the inclined surfaces SI' can reflect light beams propagated toward the inclined surfaces SI' such that the light beams are propagated toward the inclined surfaces SI. The light beams propagated toward the inclined surfaces SI can be reflected to the photosensitive regions R by the light-deflection elements 126' disposed on the inclined surfaces SI.

In an embodiment, the optical receiver 300 can also include the second light-blocking elements 210 of FIG. 5 to block light beams directly passing through the gratings 122 and propagating toward the photodetector 110.

Figure 7:
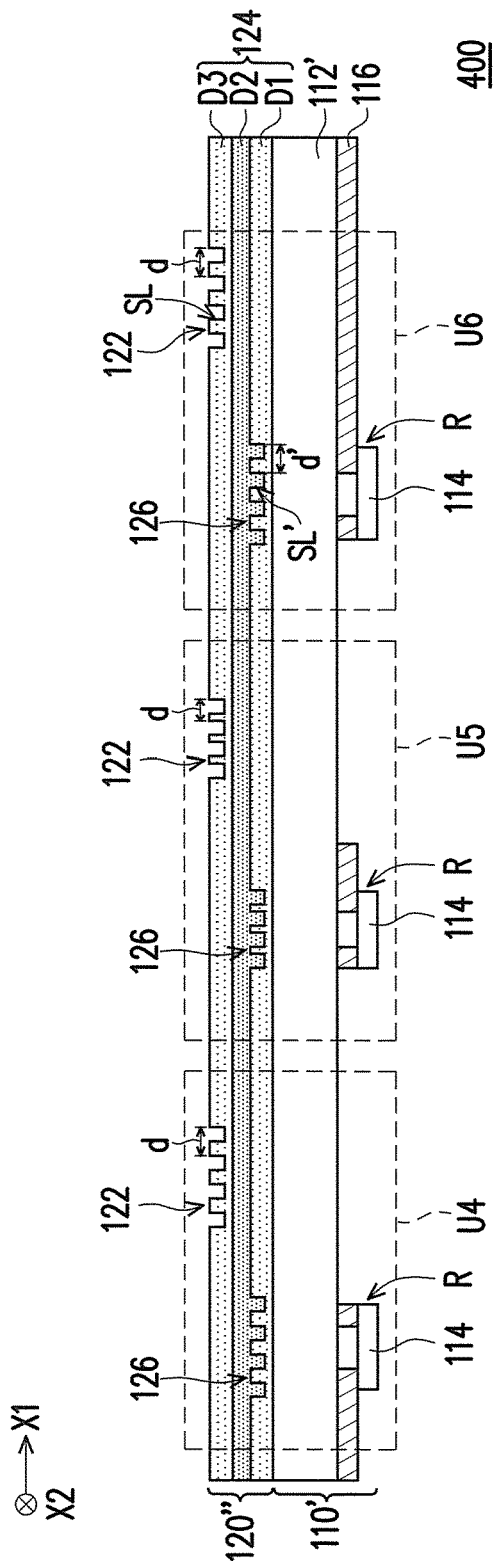

Referring to FIG. 7, an optical receiver 400 is similar to the optical receiver 100 of FIG. 1G. The main difference between the two is: a photodetector 110' of the optical receiver 400 includes a substrate 112', a plurality of photodiodes 114, and a redistribution layer (RDL) 116. The substrate 112' can be a glass substrate or a plastic substrate. The photodiodes 114 are disposed below the substrate 112', and the regions in which the photodiodes 114 are located are the photosensitive regions R. The photodiodes 114 are adapted to convert received light signals into electrical signals. The RDL 116 is located between the photodiodes 114 and the substrate 112' and is adapted to export electrical signals. Therefore, a waveguide 120" of the present embodiment can omit the manufacture of the through-holes TH of FIG. 1F and elements used to export signals (such as the first light-blocking elements P of FIG. 1G).

Figure 8:
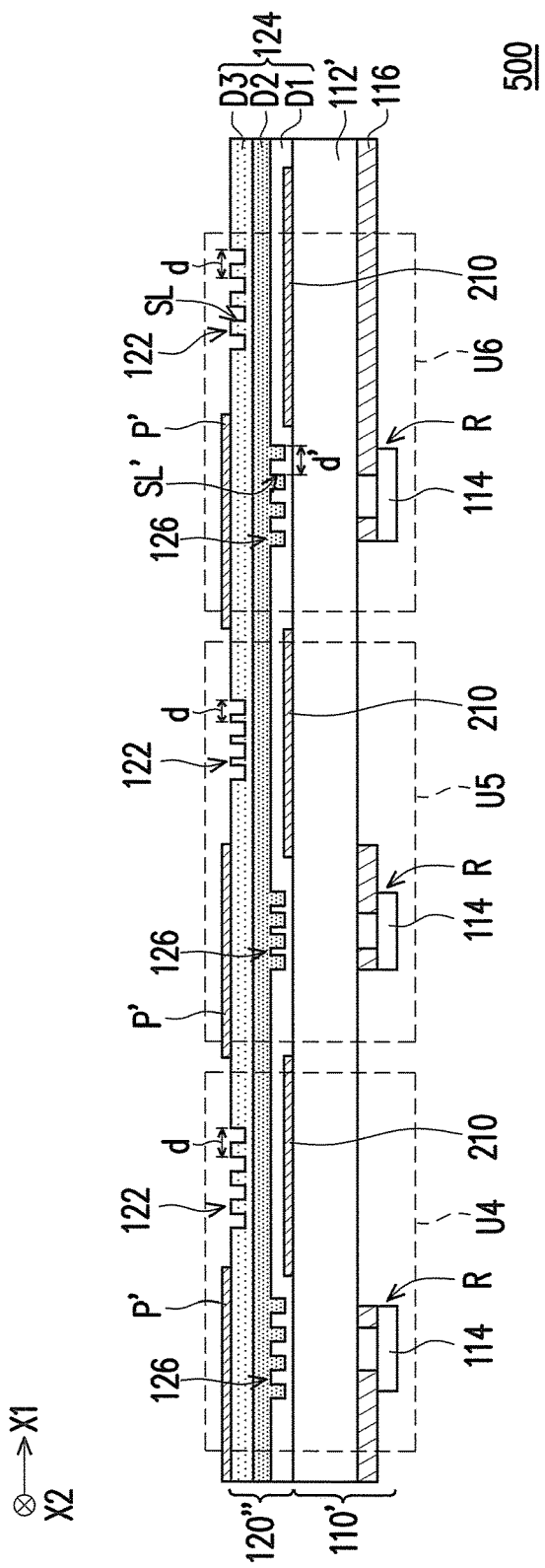

Referring to FIG. 8, an optical receiver 500 is similar to the optical receiver 400 of FIG. 7. The main difference between the two is: the optical receiver 500 further includes a plurality of first light-blocking elements P'. The first light-blocking elements P' are disposed on the third dielectric layer D3 of the waveguide 120" and respectively located between two adjacent gratings 122. The first light-blocking elements P' block the light-deflection elements 126 to prevent direct irradiation to the light-deflection elements 126 by external light beams. Moreover, the first light-blocking elements P' also block the photosensitive regions R (the regions in which the photodiodes 114 are located) to prevent direct irradiation to the photosensitive regions R by external light beams. In the present embodiment, the first light-blocking elements P are only used to block light beams and do not have to export signals collected by the photosensitive regions R, and therefore the optical channels 124 of the optical receiver 500 can omit the manufacture of the through-holes TH of FIG. 1F, and the first light-blocking elements P' do not have to be in contact with the photosensitive regions R.

Moreover, the optical receiver 500 further includes the second light-blocking elements 210 of FIG. 5. The second light-blocking elements 210 are disposed on the photodetector 110' and located between the waveguide 120'' and the photodetector 110', wherein each of the second light-blocking elements 210 is located below one of the gratings 122. The second light-blocking elements 210 are adapted to block light beams directly passing through the gratings 122 and propagating toward the photodetector 110. The second light-blocking elements 210 can be single or multiple metal layers, but are not limited thereto.

In another embodiment, the optical receiver 500 can also omit one of the first light-blocking elements P' and the second light-blocking elements 210. In yet another embodiment, at least one of the first light-blocking elements P' and the second light-blocking elements 210 can be replaced by solar cell elements.

Figure 9:
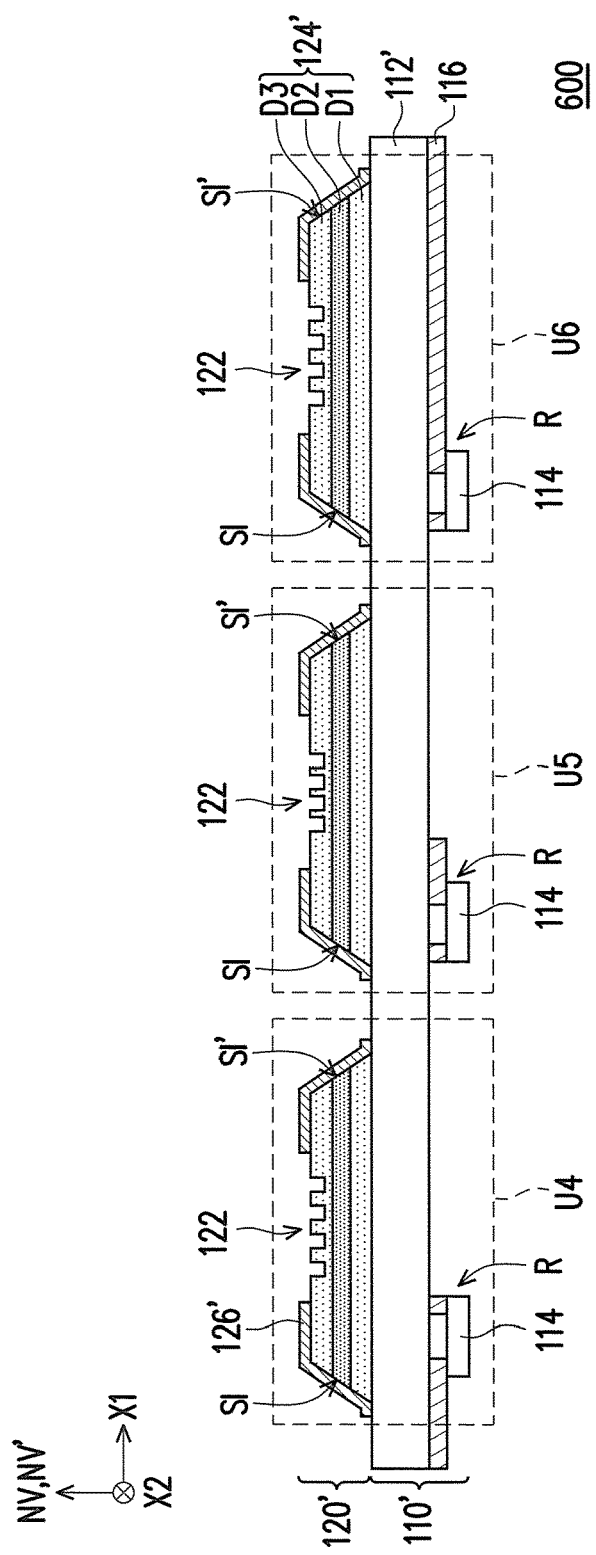

Referring to FIG. 9, an optical receiver 600 is similar to the optical receiver 300 of FIG. 6. The main difference between the two is: the photodetector 110' of the optical receiver 600 adopts the structure of FIG. 7. The description of the photodetector 110' is as provided for the content related to FIG. 7 and is not repeated herein.

Figure 10:
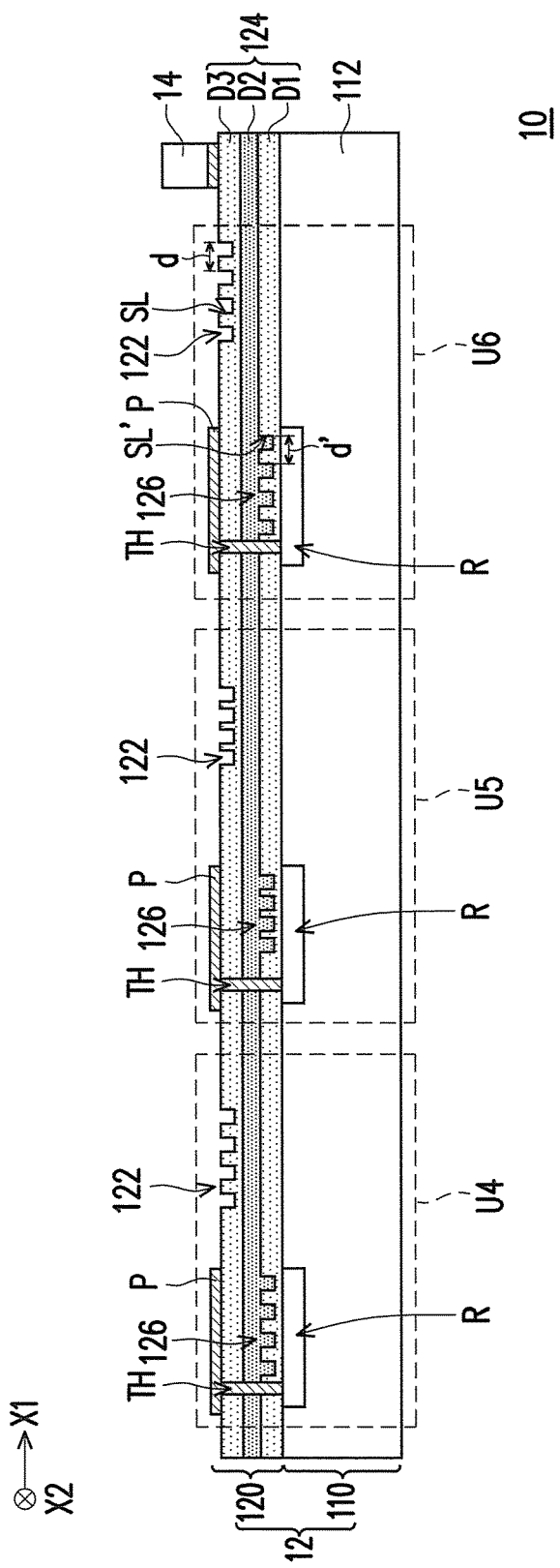
FIG. 10 is a cross-sectional schematic view of an optical transceiver according to an embodiment of the disclosure.

FIG. 10 is a cross-sectional schematic view of an optical transceiver according to an embodiment of the disclosure. Referring to FIG. 10, an optical transceiver 10 includes an optical receiver 12 and an optical upload device 14. The optical receiver 12 can adopt the structure of the optical receiver 100 in FIG. 1G, but is not limited thereto. In other embodiments, the optical receiver 12 can also adopt the structures of the optical receivers 200, 300, 400, 500, and 600 in FIG. 5 to FIG. 9. The optical upload device 14 is mounted on the optical receiver 12. The optical upload device 14 transmits signals by, for instance, emitting light beams. The light beams emitted by the optical upload device 14 preferably have high directivity. For instance, the optical upload device 14 can include an infrared LED, and the light beams emitted by the optical upload device 14 are infrared, but the disclosure is not limited thereto.

Based on the above, in the optical receiver of the disclosure, the waveguide has a plurality of gratings. Using the characteristic that the gratings have angle of incidence dependency, the waveguide is adapted to collect light beams incident on the waveguide at different angles via different gratings, and then propagate the light beams to the photodetector via the optical channels and the light-deflection elements. Therefore, the optical receiver of the disclosure and the optical transceiver adopting the optical receiver can have a large angle for receiving light. In an embodiment, by changing the arrangement directions of the slits SL in the gratings, the direction for receiving light of the optical receiver and the optical transceiver adopting the optical receiver can be further increased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An optical receiver, comprising:
 a photodetector comprising a plurality of photosensitive regions arranged in an array; and
 a waveguide disposed on the photodetector and comprising a plurality of gratings, a plurality of optical channels, and a plurality of light-deflection elements, wherein the gratings are respectively adapted to collect light beams incident on the waveguide at different angles, the optical channels are adapted to propagate the light beams collected by the gratings, the light-deflection elements are disposed on transmission paths of the light beams propagating in the optical channels and are located above the photosensitive regions, and the light-deflection elements are adapted to propagate the light beams propagating in the optical channels to the photosensitive regions.

2. The optical receiver of claim 1, wherein the photodetector is a CMOS sensor or a photodiode array.

3. The optical receiver of claim 1, wherein the optical channels comprise a first dielectric layer, a second dielectric layer, and a third dielectric layer stacked on the photodetector in order, and an index of refraction of the second dielectric layer is higher than indices of refraction of the first dielectric layer and the third dielectric layer.

4. The optical receiver of claim 3, wherein the gratings are formed on the third dielectric layer.

5. The optical receiver of claim 3, wherein the light-deflection elements are respectively a reflective layer, the optical channels have a plurality of inclined planes located on the photosensitive regions, and the light-deflection elements cover the inclined planes.

6. The optical receiver of claim 3, wherein the light-deflection elements are respectively a grating, and the light-deflection elements are formed on the first dielectric layer.

7. The optical receiver of claim 1, wherein each of the gratings comprises a plurality of slits arranged in parallel, the slits of each of the gratings have an arrangement pitch, and the gratings of the waveguide have two or more arrangement pitches.

8. The optical receiver of claim 1, further comprising:
 a plurality of first light-blocking elements blocking the photosensitive regions, wherein the first light-blocking elements are disposed on the waveguide and are respectively located between two adjacent gratings.

9. The optical receiver of claim 8, wherein each of the light-deflection elements is located between one of the first light-blocking elements and a corresponding photosensitive region.

10. The optical receiver of claim 8, further comprising:
 a plurality of second light-blocking elements located between the waveguide and the photodetector, wherein each of the second light-blocking elements is located below one of the gratings.

11. The optical receiver of claim 10, wherein the first light-blocking elements and the second light-blocking elements are respectively a reflective layer or a solar cell element.

12. The optical receiver of claim 8, wherein a ratio of a total area of the first light-blocking elements and a total area of the optical receiver is less than 20%.

13. The optical receiver of claim 1, wherein a ratio of a total area of the gratings and a total area of the optical receiver is greater than or equal to 50%.

14. An optical transceiver, comprising:
the optical receiver of claim 1; and
an optical upload device mounted on the optical receiver.

15. The optical transceiver of claim 14, wherein the optical upload device comprises an infrared LED.

16. An optical receiver, comprising:
a photodetector comprising a plurality of photosensitive regions arranged in an array;
a waveguide disposed on the photodetector and comprising a plurality of gratings and a plurality of optical channels, wherein the gratings are located on the optical channels and are respectively adapted to collect light beams incident on the waveguide at different angles; and
a plurality of first light-blocking elements blocking the photosensitive regions, wherein the first light-blocking elements are disposed on the waveguide and are respectively located between two adjacent gratings.

17. The optical receiver of claim 16, further comprising:
a plurality of light-deflection elements disposed on transmission paths of the light beams propagating in the optical channels and located above the photosensitive regions, wherein the light-deflection elements are adapted to propagate the light beams propagating in the optical channels to the photosensitive regions.

18. The optical receiver of claim 17, wherein the light-deflection elements are respectively a reflective layer, the optical channels have a plurality of inclined planes located on the photosensitive regions, and the light-deflection elements cover the inclined planes.

19. The optical receiver of claim 17, wherein the light-deflection elements are respectively a grating, and the light-deflection elements are formed on the optical channels.

20. The optical receiver of claim 17, wherein each of the light-deflection elements is located between one of the first light-blocking elements and a corresponding photosensitive region.

21. The optical receiver of claim 16, further comprising:
a plurality of second light-blocking elements located between the waveguide and the photodetector, wherein each of the second light-blocking elements is located below one of the gratings.

22. The optical receiver of claim 21, wherein the first light-blocking elements and the second light-blocking elements are respectively a reflective layer or a solar cell element.

23. The optical receiver of claim 16, wherein a ratio of a total area of the first light-blocking elements and a total area of the optical receiver is less than 20%.

24. The optical receiver of claim 16, wherein a ratio of a total area of the gratings and a total area of the optical receiver is greater than or equal to 50%.

* * * * *